United States Patent
Suzuki (10) Patent No.: US 6,172,922 B1
(45) Date of Patent: Jan. 9, 2001

(54) SEMICONDUCTOR MEMORY DEVICE HAVING A SINGLE TRANSISTOR TWO FUNCTIONS AS A GND/Y SELECTING TRANSISTOR AND A PRECHARGE SELECTING TRANSISTOR

(75) Inventor: Kazuteru Suzuki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/352,349

(22) Filed: Jul. 13, 1999

(30) Foreign Application Priority Data

Jul. 13, 1998 (JP) .................................................. 10-197106

(51) Int. Cl.[7] ...................................................... G11C 7/00
(52) U.S. Cl. ................ 365/203; 365/230.03; 365/185.23
(58) Field of Search .............................. 365/203, 185.23, 365/230.03

(56) References Cited

U.S. PATENT DOCUMENTS

| 4,811,301 | * | 3/1989 | Houston | 365/203 |
| 5,369,620 | * | 11/1994 | Sugibayashi | 365/230.03 |
| 5,621,697 | * | 4/1997 | Weng et al. | 365/230.06 |
| 5,703,820 | * | 12/1997 | Kohno | 365/204 |
| 5,768,199 | * | 6/1998 | Inoue | 365/203 |
| 5,771,190 | * | 6/1998 | Okamura | 365/154 |

* cited by examiner

Primary Examiner—Richard Elms
Assistant Examiner—Tuan T. Nguyen
(74) Attorney, Agent, or Firm—Sughrue, Mion, Zinn, Macpeak & Seas, PLLC (57) ABSTRACT

In a semiconductor memory device, a memory cell array 108 and a GND selector circuit 107 arranged in the vicinity of the memory cell array are connected via a metal wiring. In the GND selector circuit 107, a single transistor is connected to a single line of the metal wiring. A GND selecting transistor in the GND selector circuit 107 is also used as a precharge selecting transistor. The memory cell array 108 and a Y selector circuit 110 arranged in the vicinity of the memory cell array are connected via a digit line. In the Y selector circuit 110, a single digit-selecting transistor is connected to a single digit line. The digit-selecting transistor is also used as a precharge selecting transistor.

6 Claims, 6 Drawing Sheets

SEMICONDUCTOR MEMORY DEVICE HAVING A SINGLE TRANSISTOR TWO FUNCTIONS AS A GND/Y SELECTING TRANSISTOR AND A PRECHARGE SELECTING TRANSISTOR

BACKGROUND OF THE INVENTION

This invention relates to a semiconductor memory device and, in particular, to selection of a memory cell and a bus precharge method in a semiconductor memory device using flat memory cells.

Figure 1:
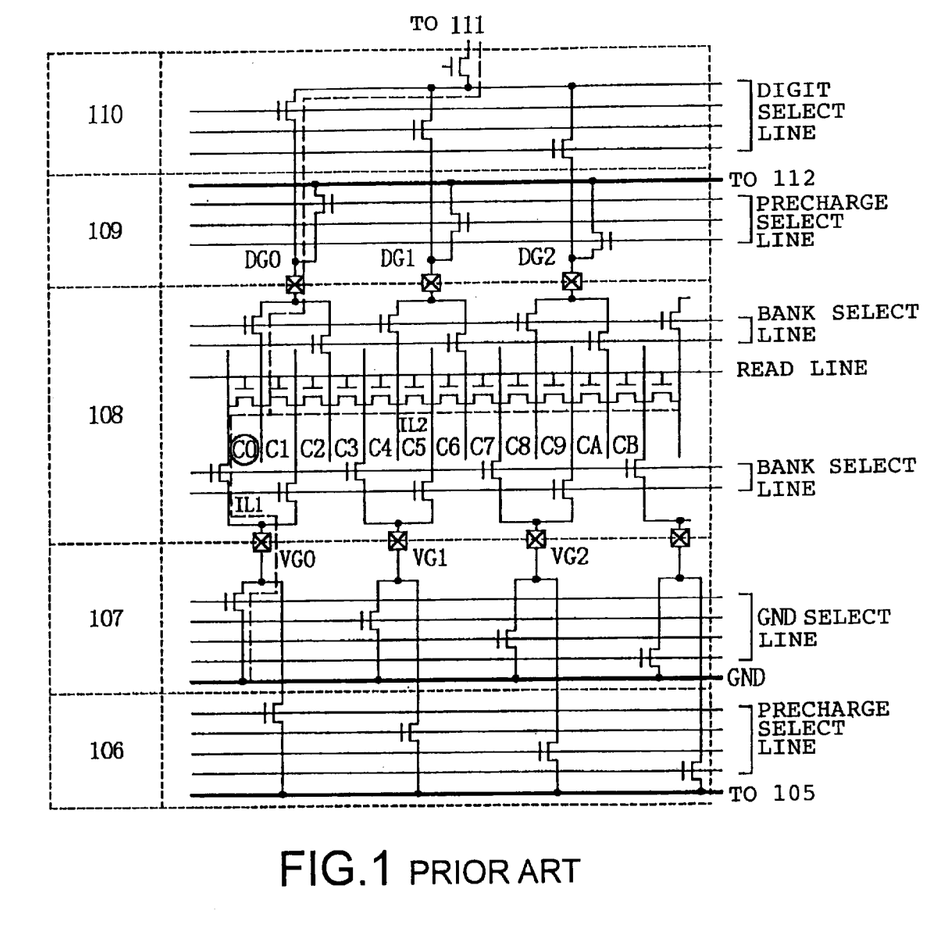
FIG. 1 is a circuit diagram of a conventional semiconductor memory device using flat memory cells.

FIG. 1 is a circuit diagram of a memory cell array and a peripheral circuit thereof in a semiconductor memory device using flat memory cells. As shown in the figure, the illustrated circuit comprises a memory cell array 108, a sense amplifier 111 (the block will later be illustrated), a Y selector circuit 110, a GND selector circuit 107, precharge circuits 105 and 112 (the blocks will later be illustrated), and precharge selector circuits 106 and 109.

Next, a traditional operation upon selection of a memory cell will briefly be described. At first, a word line and a bank select line are selected. The Y selector circuit 110 selects a digit line DG0 while the GND selector circuit 107 selects a GND line VG0. An electric current from the sense amplifier 111 to the GND line GND in the above-mentioned state is represented by a current path IL1. At this time instant, a selected memory cell C0 is determined. If the selected memory cell C0 is an OFF bit (memory cell through which no electric current flows), an electric current does not flow from the sense amplifier 111 towards the GND line GND. However, if memory cells C1, C2, C3, ..., Cn successively adjacent to the memory cell C0 are ON bits (memory cells through which an electric current flows), the electric current flows towards a current path IL2 as illustrated in the figure to inhibit the operation of the sense amplifier 111.

In order to suppress the above-mentioned phenomenon, the precharge circuit 105 is used. The precharge selector circuit 106 precharges a GND line VG1 adjacent to a selected data bus line to a level equal to that of the selected digit line DG0. Thus, a current flow towards the current path IL2 is interrupted. In order to detect a small current by the sense amplifier 111, it is necessary to minimize the amount of the electric current flowing through the current path IL2 illustrated in FIG. 1. For this purpose, a digit line DG1 may be precharged by the precharge circuit 112 and the precharge selector circuit 109, in addition to the GND line VG1.

PROBLEM TO BE SOLVED BY THE INVENTION

In the above-mentioned conventional semiconductor memory device using flat memory cells, the precharge circuit 105 is essential. In addition to the Y selector circuit 110 and the GND selector circuit 107, the precharge selector circuit 106 is required. Furthermore, in addition to the precharge circuit 105 and the precharge selector circuit 106 for precharging the GND line GND, the precharge circuit 112 and the precharge selector circuit 109 for selective precharge of a digit line are required.

It is an object of this invention to implement by a single transistor two functions as a Y selector of a Y selector circuit and a precharge selector of a precharge selector circuit for selective precharge of a digit line and to implement with a single transistor a GND selector of a GND selector circuit and a precharge selector of a precharge selector circuit for precharging a GND line, so that only one selector transistor is required to be connected to each of a single digit line and a single GND line, thereby reducing the number of transistors used in a memory and suppressing an increase in layout area.

MEANS TO SOLVE THE PROBLEM

According to this invention, there is provided a semiconductor memory device comprising a memory cell array using flat memory cells, a sense amplifier connected to the memory cell array, a GND selector circuit arranged in the vicinity of the memory cell array and connected to the memory cell array, a precharge circuit, and a precharge selector circuit connected to the GND selector circuit and the precharge circuit, wherein the memory cell array and the GND selector circuit are connected via a metal wiring, the GND selector circuit having selectors each of which is a single transistor connected to one metal line of the metal wiring, the GND selecting transistor of the GND selector circuit being commonly used as a precharge selecting transistor of the precharge selector circuit.

According to this invention, there is also provided a semiconductor memory device comprising a memory cell array using flat memory cells, a sense amplifier, a Y selector circuit connected to the sense amplifier, a precharge circuit, and a precharge selector circuit, wherein the memory cell array and the Y selector circuit are connected to digit lines, the Y selector circuit having selectors each of which is a single transistor connected to each single digit line among the digit lines, the digit line selecting transistor of the Y selector circuit being commonly used as a precharge line selecting transistor of the precharge selector circuit.

According to this invention, there is also provided a semiconductor memory device comprising a memory cell array using flat memory cells, a sense amplifier connected to the memory cell array, a GND selector circuit arranged in the vicinity of the memory cell array and connected to the memory cell array, a first precharge circuit, a first precharge selector circuit connected to the GND selector circuit and the first precharge circuit, a Y selector circuit connected to the sense amplifier, a second precharge circuit, and a second precharge selector circuit, wherein the memory cell array and the GND selector circuit are connected via a metal wiring, the GND selector circuit having selectors each of which is a single transistor connected to one metal line of the metal wiring, the GND selecting transistor of the GND selector circuit being commonly used as a precharge selecting transistor of the precharge selector circuit, the memory cell array and the Y selector circuit being connected to digit lines, the Y selector circuit having selectors each of which is a single transistor connected to one digit line among the digit lines, the digit line selecting transistor of the Y selector circuit being commonly used as the precharge line selecting transistor of the precharge selector circuit.

MODE OF EMBODYING THE INVENTION

Next, description will be made about embodiments of this invention with reference to the drawing.

Figure 2:
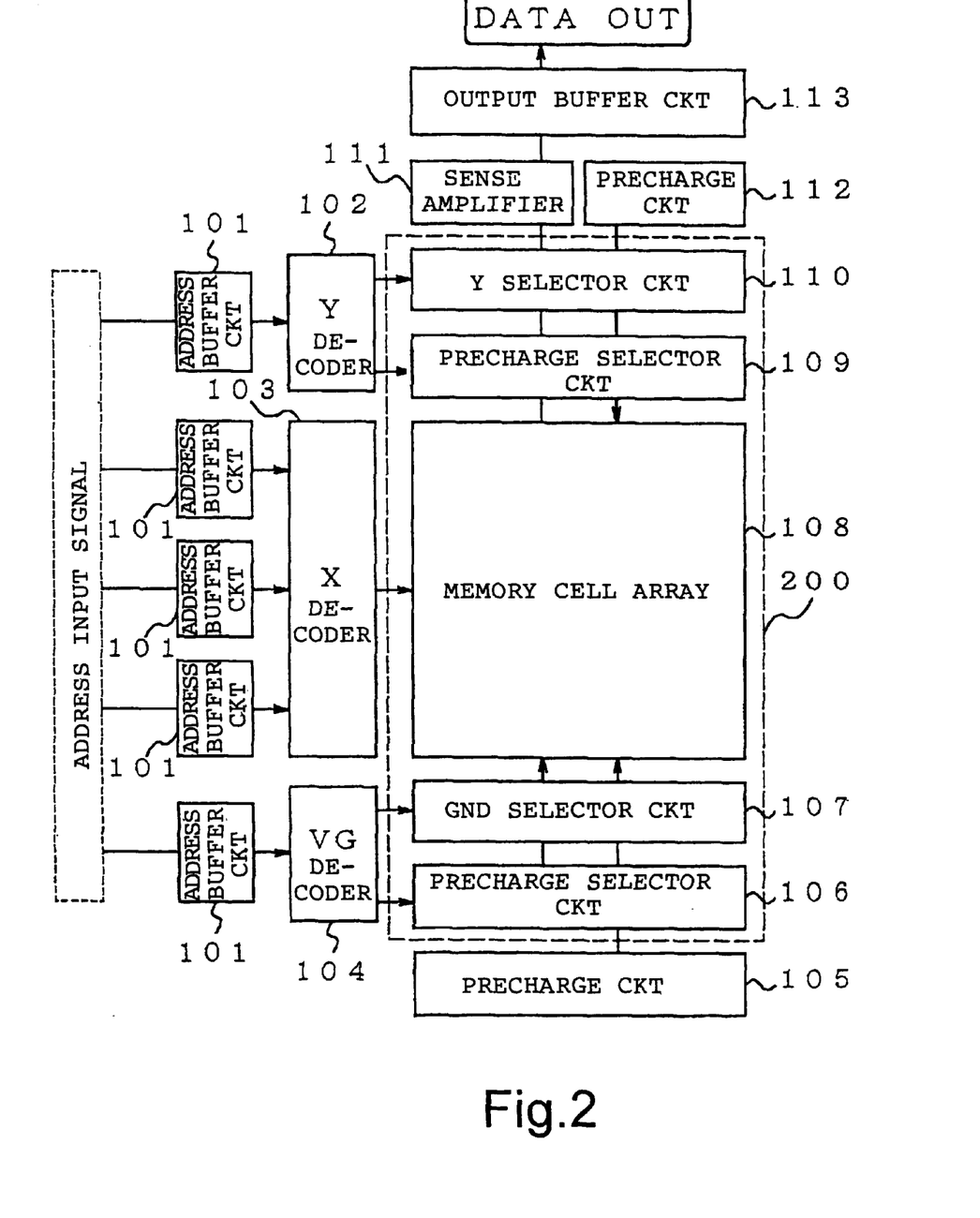
FIG. 2 is a block diagram of a semiconductor memory device using flat memory cells, according to a first embodiment of this invention.

FIG. 2 is a block diagram showing a structure of a first embodiment of this invention. As illustrated in the figure, in this embodiment, address input signals are supplied to address buffer circuits 101. By combination of the address signals, logics of decoders 102, 103, and 104 are determined to produce output signals. The output signal determined by the Y decoder 102 is supplied to a Y selector circuit 110 as a circuit for determining a selected digit line of a memory cell array 108 and to a precharge selector circuit 109 for determining an adjacent digit line to be precharged with respect to the selected digit line so that the selected digit line and the digit line to be precharged are determined.

The output signal determined by a VG decoder 104 is supplied to a GND selector circuit 107 for determining a selected GND line and to a precharge selector circuit 106 for determining a GND line to be precharged. Selected lines (word line, bank select line) selected by an X decoder 103 are supplied to gates of a bank selector transistor and a selected cell of a memory cell portion on the digit line and the GND line selected by the Y selector circuit 110 and the GND selector circuit 107. To a current path selected by the above-mentioned circuits, an electric current is supplied from a sense amplifier 111. Judgement is made about on or off of the memory cell in dependence upon whether or not the electric current flows. Judgement data obtained by the sense amplifier 111 are delivered from an output buffer circuit 113 to the outside. Each of the circuits and the memory cells in a block 200 in FIG. 2 is an N-channel enhancement MISFET (metal insulator semiconductor field effect transistor). The foregoing is a reading operation of the semiconductor memory device as a whole.

Figure 3:
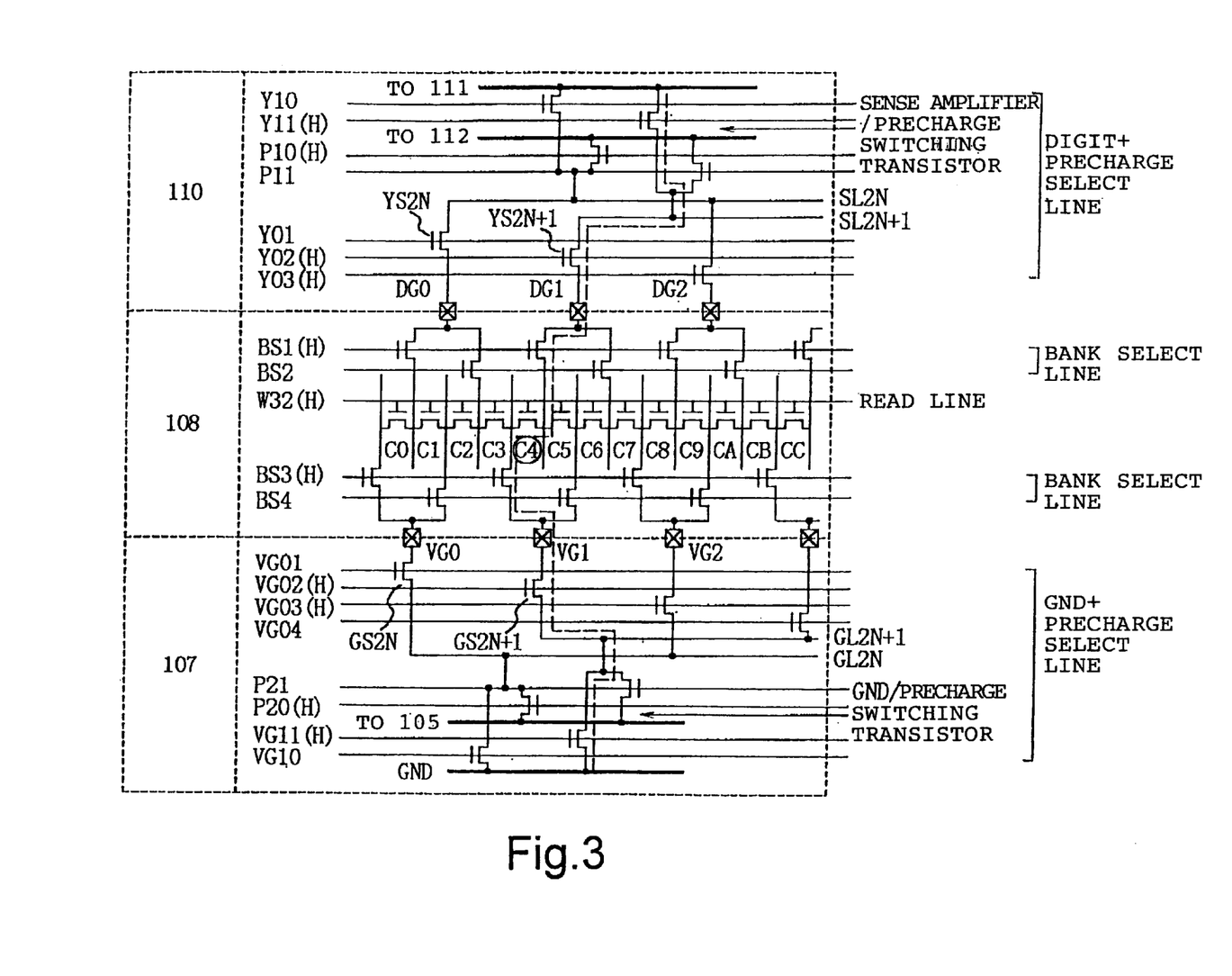
FIG. 3 is a circuit diagram showing the detail of a part of the semiconductor memory device illustrated in FIG. 2, for use in describing an operation of the semiconductor memory device in FIG. 2.

As illustrated in FIG. 3, the semiconductor memory device using flat memory cells has a circuit structure comprising memory cells (C0, C1, ..., Cn), the sense amplifier circuit 111 for detecting the electric current flowing through a path selected by the Y selector circuit 110, the word line 32, the bank select line BS3, and the GND selector circuit 107 to judge on or off of the memory cell, the Y selector circuit 110 for selecting among a plurality of digit lines (DG0, DG1, ..., DGn) a digit line linked to the selected memory cell, and the GND selector circuit 107 for selecting among a plurality of GND lines (VG0, VG1, ..., VGn) a GND line linked to the selected memory cell. Let even-numbered and odd-numbered digit lines be represented by DG2N and DG2N+1, respectively. A group of transistors in the Y selector circuit which are connected to the even-numbered digit lines DG2N is collectively represented by TRANSISTOR YS2N while a group of transistors in the Y selector circuit which are connected to the odd-numbered digit lines DG2N+1 are collectively represented by TRANSISTOR YS2N+1. In this event, the even-numbered digit lines DG2N are connected to source portions of TRANSISTOR YS2N while the odd-numbered digit lines DG2N+1 are connected to source portions of TRANSISTOR YS2N+1.

In TRANSISTOR YS2N, drain portions of the transistors are connected in common via a node SL2N. In TRANSISTOR YS2N+1, drain portions of the transistors are connected in common via a node SL2N+1. Between the nodes SL2N and SL2N+1 in the Y selector circuit and the sense amplifier and the precharge circuit, a sense amplifier/precharge switching transistor is arranged. In case where a digit line in the even-numbered digit lines DG2 is linked to the selected memory cell, the sense amplifier and the node SL2N are connected. In this case, the node SL2N+1 is connected to the precharge circuit. On the contrary, in case where a digit line in the odd-numbered digit lines DG2N+1 is linked to the selected memory cell, the node SL2N+1 is connected to the sense amplifier while the node SL2N is connected to the precharge circuit.

Likewise, in the GND selector circuit, the even-numbered and the odd-numbered GND lines are represented by GND line VG2N and GND line VG2N+1, respectively. A group of transistors in the GND selector circuit which are connected to the GND lines VG2N are collectively represented by TRANSISTOR GS2N while a group of transistors in the GND selector circuit which are connected to the GND lines VG2N+1 are collectively represented by TRANSISTOR GS2N+1. In this event, the GND lines VG2N are connected to drain portions of TRANSISTOR GS2N while the GND lines VG2N+1 are connected to drain portions of TRANSISTOR GS2N+1.

In TRANSISTOR GS2N, source portions of the transistors are connected in common via a node GL2N. In TRANSISTOR GS2N+1, source portions of the transistors are connected in common via a node GL2N+1. Between the nodes GL2N and GL2N+1 in the GND selector circuit and the GND and the precharge circuit, a GND/precharge switching transistor is arranged. In case where the GND line in TRANSISTOR VG2N is linked to the selected memory cell, the GND line and the node GL2N are connected. In this case, the node GL2N+1 is connected to the precharge circuit. On the contrary, in case where the GND line in TRANSISTOR VG2N+1 is linked to the selected memory cell, the node GL2N+1 is connected to the GND line while the node GL2N is connected to the precharge circuit. Thus, the Y selector and the precharge selector can be commonly implemented by a single transistor while the GND line and the precharge selector can be commonly implemented by a single transistor.

Referring to FIG. 3, the operation will be described. It is assumed here that the selected memory cell is the memory cell C4. In order to read the memory cell, selection is made of the bank select lines BS1 and BS3 and the word line W32. In order to select the digit line DG1, Y11 and Y02 in the Y selector circuit are selected. In order to select the GND line VG1, the ground select lines VG11 and VG02 in the GND selector circuit are selected. Upon reading the memory cell C4, the digit line and the GND line to be precharged are DG2 and VG2, respectively. It is noted here that the digit line and the GND line to be precharged are adjacent to the digit line DG1 and the GND line VG1 selected to read the data, respectively. Thus, assuming that the digit line and the GND line for data selection are odd-numbered ones (2n+1), the digit line and the GND line to be precharged are even-numbered ones (2n).

Figure 4:
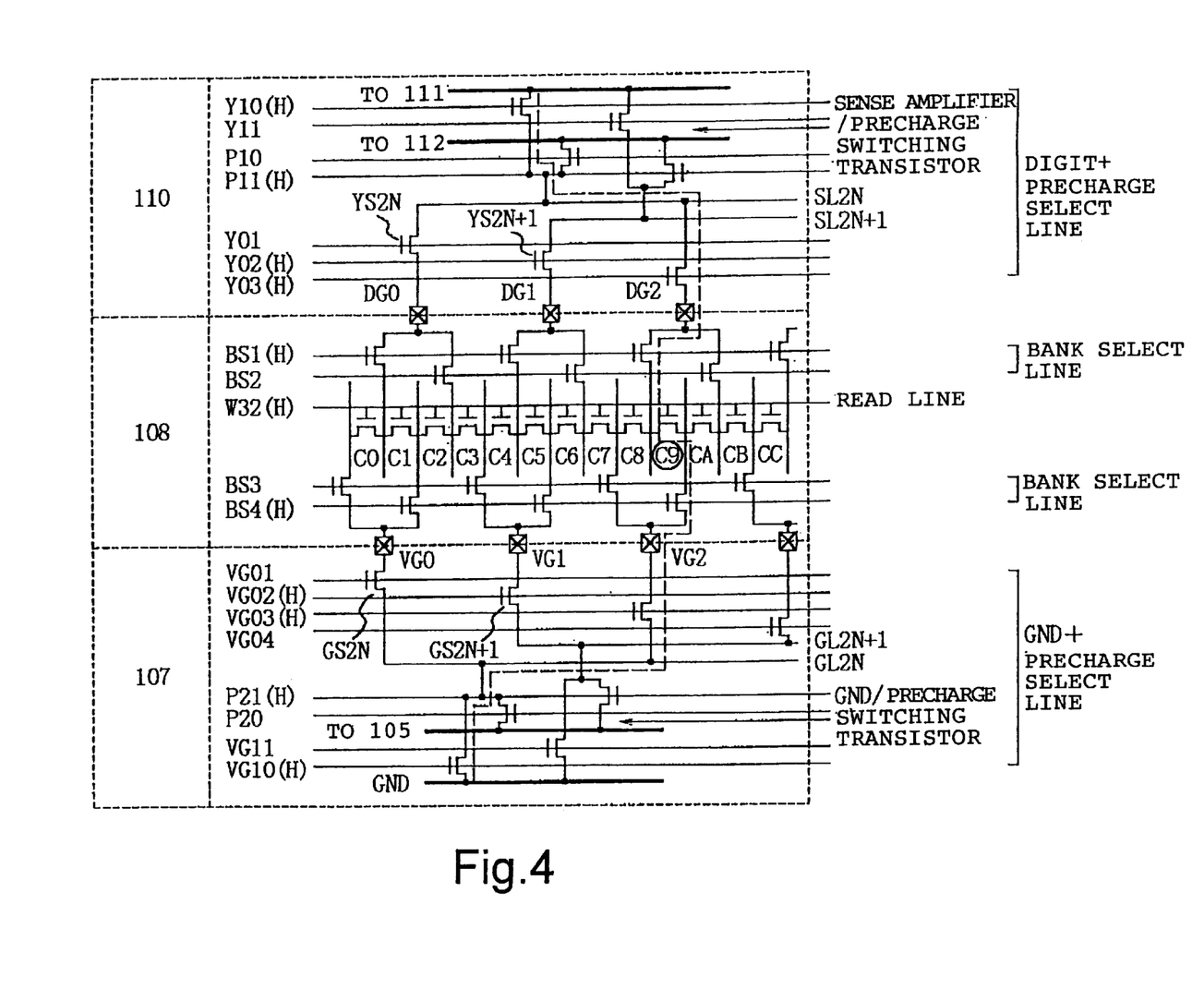
FIG. 4 is a view similar to FIG. 3, for use in describing another operation of the semiconductor memory device in FIG. 2.

Next referring to FIG. 4, consideration will be made about the case where the memory cell C9 is selected. The bank select lines BS1 and BS4 and the word line W32 are selected. The digit line DG2 and the GND line VG2 are selected lines. The digit line and the GND line to be precharged upon selecting the memory cell C9 are DG1 and VG1, respectively. Thus, contrary to the above-mentioned selection of the memory cell C4, the digit line and the GND line to be precharged are odd-numbered ones (2n+1). In other words, in case where the selected digit line is even-numbered, the data bus line to be precharged is odd-numbered. In case where the selected data bus line is odd-numbered, the digit line to be precharged is even-numbered. This also applies to the GND line. Specifically, in case where the selected GND line is even-numbered, the GND line to be precharged is odd-numbered. In case where the selected GND line is odd-numbered, the GND line to be precharged is even-numbered. Thus, it is possible to divide the transistors in the Y selector circuit into a selector transistor group connected to the sense amplifier and a transistor group connected to the precharge circuit. As to the manner of division, the transistors are divided into TRANSISTOR YS2N located at (2n)-numbered orders and TRANSISTOR YS2N+1 located at (2n+1)-numbered orders.

In case where TRANSISTOR YS2N is used as the Y selector circuit, TRANSISTOR YS2N+1 serves as the precharge selector circuit. In case where TRANSISTOR YS2N+1 is used as the Y selector circuit, TRANSISTOR YS2N serves as the precharge selector circuit. Thus, a single transistor can serve as a Y selector transistor and a precharge selector transistor. This also applies to the GND selector circuit. A group of transistors located at the even-numbered orders and a group of transistors located at the odd-numbered orders are represented by TRANSISTOR GS2N and TRANSISTOR GS2N+1, respectively. Then, in case where TRANSISTOR GS2N is selected, TRANSISTOR GS2N+1 serves as the precharge selector. In case where TRANSISTOR GS2N+1 is selected, TRANSISTOR GS2N serves as the precharge selector. Thus, in the GND selector circuit also, a single transistor can serve as the GND selector and the precharge selector.

In this embodiment, with respect to the selected digit line and the selected GND line, the adjacent digit line and the adjacent GND line are precharged. Similar effect will be obtained in case of precharging the adjacent digit line alone or precharging the adjacent GND line alone.

For example, it is assumed that the memory cells of 1024 bits (256 digit lines and 256 GND lines) are arranged in a direction of word lines. In this case, comparison is made of the number of transistors in the Y selector, the precharge selector, and the GND selector. The result is shown in Table 1.

TABLE 1

| | | Conventional Example Number of Transistor | Embodiment of This Invention Number of Transistor |
|---|---|---|---|
| Y selector | Y1 selector | 16 | — |
| | Y0 selector | 256 | 256 |
| PC selector | PC1 selector | 16 | — |
| | PC0 selector | 256 | — |
| Digit/Precharge Switching Transistor | Digit/Precharge Switching Transistor | — | 64 |
| GND Selector | GND1 selector | 16 | — |
| | GND2 selector | 256 | 256 |
| PC Selector | PC3 Selector | 16 | — |
| | PC2 Selector | 256 | — |
| GND/Precharge Switching Transistor | GND/precharge Switching Transistor | — | 64 |
| | Total Number in Selector Portion | 1088 | 640 |

Figure 5:
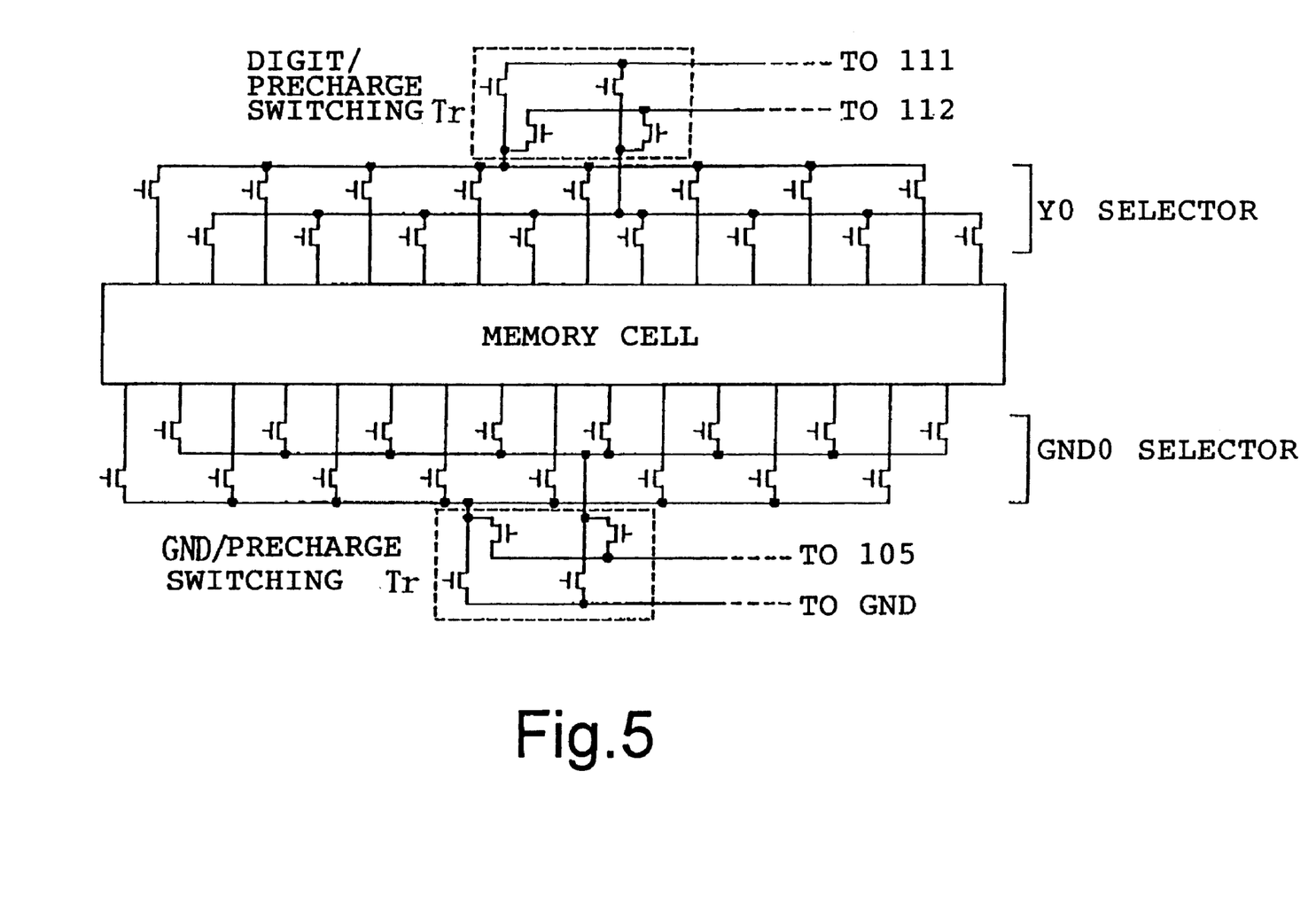
FIG. 5 shows a circuit structure of a selector portion in this invention.
Figure 6:
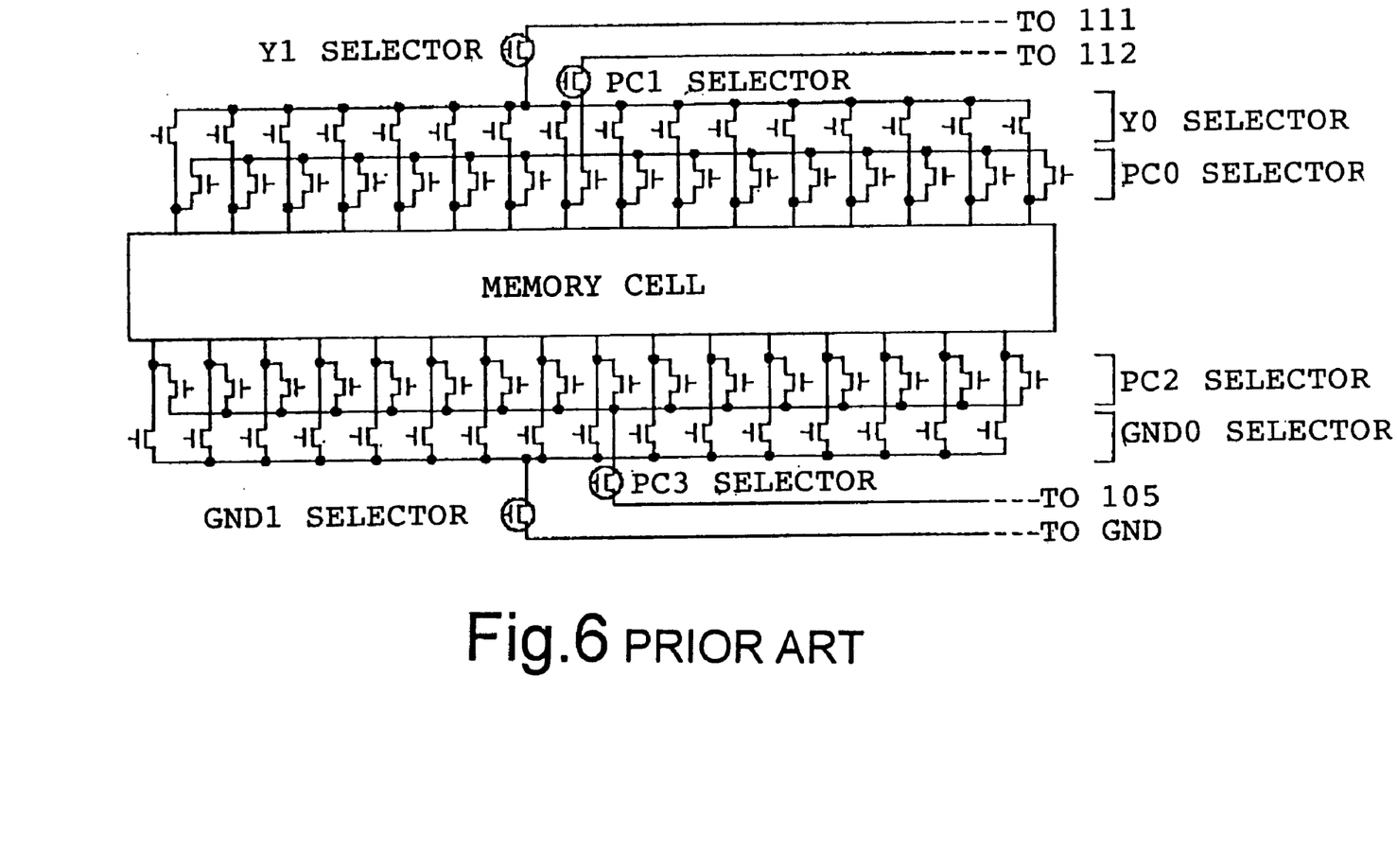
FIG. 6 shows a circuit structure of a conventional selector portion.

Comparing the total number of transistors in all of the selectors, the transistors, 1088 in number, are required in the conventional example while the number of transistors can be reduced to 640 according to this invention. FIG. 5 shows a circuit structure of the selector portion according to this invention while FIG. 6 shows a circuit structure of the conventional selector circuit.

As described above, according to this invention, two functions as the Y selector and the precharge selector for selective precharge of a digit line are implemented by a single transistor. Likewise, two functions as the GND selector and the precharge selector for precharging a GND line are implemented by a single transistor. Thus, it is sufficient that a single selector transistor is connected to each of a single digit line and a single GND line. Therefore, it is possible to considerably reduce the number of transistors used in the memory and to suppress an increase in layout area.

What is claimed is:

1. A semiconductor memory device comprising a memory cell array using flat memory cells, a sense amplifier connected to said memory cell array, a GND selector circuit arranged in the vicinity of said memory cell array and connected to said memory cell array, a precharge circuit, and a precharge selector circuit connected to said GND selector circuit and said precharge circuit, wherein said memory cell array and said GND selector circuit are connected via a metal wiring, said GND selector circuit having selectors each of which is a single transistor connected to one metal line of said metal wiring, the GND selecting transistor of said GND selector circuit being commonly used as a precharge selecting transistor of said precharge selector circuit.

2. A semiconductor memory device as claimed in claim 1, further comprising a bank select line connecting said memory cell array and said GND selector circuit.

3. A semiconductor memory device comprising a memory cell array using flat memory cells, a sense amplifier, a Y selector circuit connected to said sense amplifier, a precharge circuit, and a precharge selector circuit, wherein said memory cell array and said Y selector circuit are connected to digit lines, said Y selector circuit having selectors each of which is a single transistor connected to each single digit line among said digit lines, the digit line selecting transistor of said Y selector circuit being commonly used as a precharge line selecting transistor of said precharge selector circuit.

4. A semiconductor memory device as claimed in claim 3, further comprising a bank select line connecting said memory cell array and said Y selector circuit.

5. A semiconductor memory device comprising a memory cell array using flat memory cells, a sense amplifier connected to said memory cell array, a GND selector circuit arranged in the vicinity of said memory cell array and connected to said memory cell array, a first precharge circuit, a first precharge selector circuit connected to said GND selector circuit and said first precharge circuit, a Y selector circuit connected to said sense amplifier, a second precharge circuit, and a second precharge selector circuit, wherein said memory cell array and said GND selector circuit are connected via a metal wiring, said GND selector circuit having selectors each of which is a single transistor connected to one metal line of said metal wiring, the GND selecting transistor of said GND selector circuit being commonly used as a precharge selecting transistor of said first precharge selector circuit, said memory cell array and said Y selector circuit being connected to digit lines, said Y selector circuit having selectors each of which is a single transistor connected to one digit line among said digit lines, said digit line selecting transistor of said Y selector circuit being commonly used as a precharge line selecting transistor of said second precharge selector circuit.

6. A semiconductor memory device as claimed in claim 5, further comprising a bank select line connecting said memory cell array and said GND selector circuit, and another bank select line connecting said memory cell array and said Y selector circuit.

* * * * *